United States Patent [19]
Knutson et al.

[11] 4,035,695
[45] July 12, 1977

[54] MICROELECTRONIC VARIABLE INDUCTOR

[75] Inventors: William J. Knutson, Tamarac; Daniel M. Smith, Coral Springs, both of Fla.

[73] Assignee: Motorola, Inc., Schaumburg, Ill.

[21] Appl. No.: 492,295

[22] Filed: Aug. 5, 1974

[51] Int. Cl.$^2$ .................................... H05K 1/04
[52] U.S. Cl. .................. 361/400; 336/200; 29/602 R
[58] Field of Search .............. 336/200; 334/71, 72, 334/75, 41–46; 333/70 CR; 29/602; 325/445; 317/101 A, 101 C; 338/195

[56] References Cited
U.S. PATENT DOCUMENTS

| | | | |
|---|---|---|---|
| 3,441,804 | 4/1969 | Klemmer | 317/101 A |
| 3,471,812 | 10/1969 | Lackner | 334/45 |
| 3,486,221 | 12/1969 | Robinson | 219/121 LM |
| 3,679,940 | 7/1972 | Newman et al. | 317/101 C |
| 3,745,508 | 7/1973 | Bryder et al. | 336/200 |

FOREIGN PATENT DOCUMENTS 1,227,531   10/1966   Germany .................. 336/200

*Primary Examiner*—David Smith, Jr.
*Attorney, Agent, or Firm*—Donald B. Southard; Patrick T. King; James W. Gillman

[57] ABSTRACT

A conductor provided on an insulating support has a portion which forms an inductor. Various components are connected to the conductor, as by soldering, to provide an electronic circuit suitable for a particular application. The conductor portion which forms the inductor has parallel branches and the value of the inductance can be changed by selectively open circuiting the branches. This can be accomplished after the components are connected and the complete circuit is tested to determine whether a change in the inductance value is required. The branches can be selectively open circuited by removing a portion of the conductor by a laser beam which does not substantially heat the structure, with the heat which is produced being highly localized. Accordingly, this does not soften the solder connections of the components and there is no damaging effect on the circuit. The inductor portion as described can be connected in series with a coil, and the total inductance value of the coil and the conductor can be adjusted by cutting sections from the parallel branches to thereby provide the total inductance value required in a particular circuit application.

5 Claims, 2 Drawing Figures

MICROELECTRONIC VARIABLE INDUCTOR

BACKGROUND OF THE INVENTION

It is desired to use microelectronic circuit constructions in many applications to provide miniature electronic equipment. One such application is in miniature radio devices which are of a size to be held in the hand or worn on the person. One problem with such circuits is that miniature components which are available are not adjustable, and it is difficult to work with the same to tune or align the circuit because of the small size. In many cases the circuit must be constructed and then tested, and if the circuit operation is not within the desired limits, it is necessary to replace components, which is very time consuming and adds substantially to the cost of the circuit.

In the construction of microelectronic circuits, hybrid constructions have been used wherein certain components are formed by conductors on an insulator or substrate and other components are soldered or otherwise secured to the conductors. Inductors have been provided by spiral and microstrip conductors provided as coatings on the insulator. It has been proposed to vary the inductance value of the coils by bridging conductors across portions of the coils, but this requires a soldering operation which heats the substrate and may unsolder components which have been connected to the conductors. Although separate adjustable inductor elements can be used, these are relatively large and must be individually connected to the circuit. Accordingly, the use of a separate adjustable element results in a substantial increase in size and cost.

SUMMARY OF THE INVENTION

It is an object of the present invention to provide a microelectronic circuit including a conductor provided on an insulating support, with components connected to the conductor, and wherein the conductor includes a portion forming an inductor which has a plurality of parallel branches which can be selectively open circuited to change the inductor valve.

Another object of the invention is to provide a microelectronic circuit including a conductor having a plurality of parallel branches which form an inductor, and wherein the branches are selectively open circuited by removing sections of the conductor without disturbing the connection of components to the conductor.

A further object of the invention is to provide a microelectronic circuit wherein a discrete inductance coil is connected in series with an inductor formed by a conductor on an insulating support, with the conductor having parallel branches which can be selectively open circuited to change the value of the inductance formed by the conductor to trim the total inductance value of the coil and the conductor in series.

A still further object of the invention is to provide a method of varying the value of a microelectronic inductor wherein the inductor is constructed with parallel branches, by first testing the circuit including the inductor and selectively cutting sections from the parallel branches, as by use of a laser beam, to change the inductance values without damaging the connection of the components thereto.

In practicing the invention, a microelectric circuit is provided including a substrate or insulator having a conductor provided thereon by known means. Components are connected to the conductor to form an electronic circuit or device, such as an amplifier, with the components being soldered to the conductor. A portion of the conductor is shaped to form an inductor and has parallel branches. A section can be cut from one or more of the branches to open circuit the same, to change the current path and thereby change the inductance value. This can be accomplished after components are connected to the conductor and the circuit is operative and tested, so that the value of the inductance to provide the desired operation can be determined. The cutting of a section from the conductor by a laser beam does not heat the substrate to damage the solder connections of the components to the conductor, as very little heat is produced and the heat is highly localized.

A variable inductor formed by a conducting coating having parallel branches which can be selectively open circuited can be connected in series with a discrete coil, so that the coil and the variable inductor together form the inductance value required in a circuit. This permits the total inductance value to be adjusted after the circuit is completed and tested without in any way damaging the circuit, and without using costly equipment or procedures.

DETAILED DESCRIPTION

Figure 1:
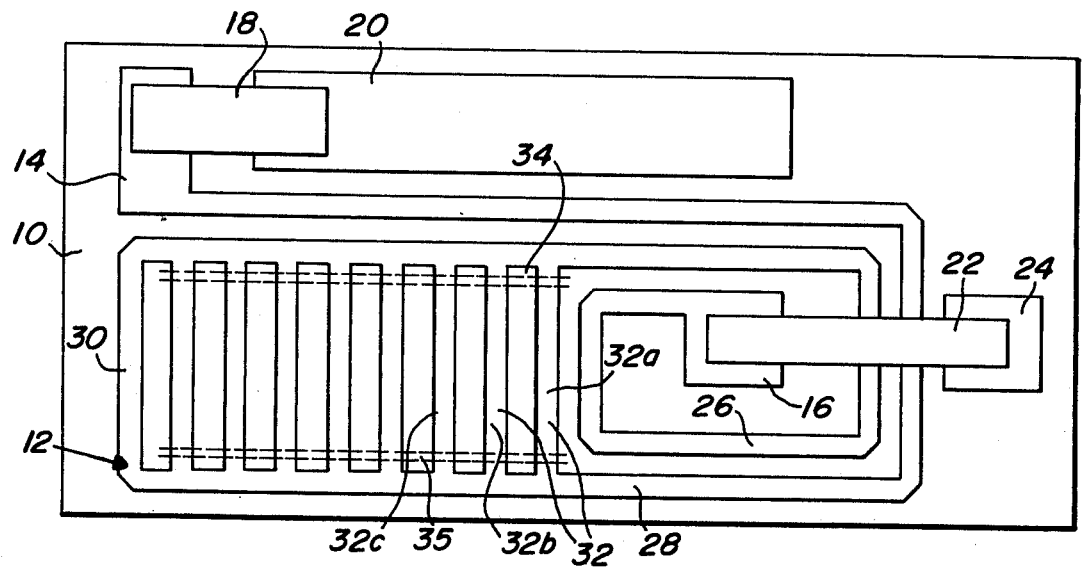
FIG. 1 illustrates a microelectric variable inductor in accordance with the invention.

FIG. 1 shows a substrate 10, which may be made of ceramic or of other suitable insulating material, on which a conductor 12 is provided by any known method. The conductor has a pair of end terminals 14 and 16 to which other components may be connected. For example, a capacitor 18 is shown connected between the terminal 14 and another conductor 20 on the substrate 10. The terminal 16 is connected by a jumper connection 22 to a further conductor 24. The conductors 20 and 24 may be connected to other components in various known circuit configurations.

It will be noted that the terminal 16 forms the center of a spiral conductor which has a first turn 26 thereabout and a second turn 28 which includes a loop 30 having a plurality of bridges 32 thereacross. The bridge 32a, which is closest to the center terminal 16, forms a conducting path so that the additional bridges 32 and the remainder of the loop 30 will be relatively ineffective, since the current in the second term 28 will flow through the bridge 32a and will continue to the terminal 14.

When the circuit including the conductor 12 is assembled with other components, such as the capacitor 18, to form a complete operative circuit, the circuit can be tested to determine the characteristics thereof. For example, the inductor formed by conductor 12 may be part of a tuned circuit which is to be aligned for operation at a particular frequency. The value of this inductor can be changed in small increments, so that the change appears almost continuous, by cutting the bridges 32 to thereby effectively lengthen the second loop 28 of the spiral conductor. If the bridge 32a is cut at the two ends thereof, as indicated by the broken lines 34 and 35, the current will flow through the second bridge 32b, and the inductance value will be slightly increased.

If more inductance is required, the bridge 32b can be cut and the current will flow through the bridge 32c. This operation can continue until the full length of the loop is in the circuit to provide the maximum inductance value.

In order to provide the change in inductance without affecting the remainder of the circuit, a laser beam can be used to cut out sections 34 and 35 of the bridges 32 adjacent the ends thereof which are connected to the loop 30. This cutting of the conductors by a laser beam produces only a very small amount of heat, and the heat is localized so that it will not affect the soldering of components to the conductor. That is, the jumper 22 which may be soldered to the terminal 16 would not become disconnected by the laser beam applied along the paths 34 and 35. Similarly, the capacitor 18 would not become disconnected from the terminal 14 of the conductor. This makes it possible to vary the inductance after the circuit is completely assembled and without affecting the connections to the circuit.

The loop 30 with the bridges 32 can be constructed so that when the bridge 32a is effective to provide a path for current, the inductance value will tend to be at the minimum value required. In such case, the proper inductance value can be provided by cutting predetermined ones of the bridges until the inductance value increases to the desired value.

Figure 2:
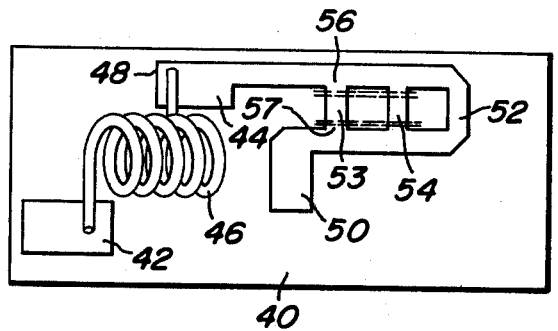
FIG. 2 illustrates a coil connected in series with a microelectric variable inductor.

In FIG. 2 there is shown a second embodiment of the invnetion in which an insulating substrate 40 has conductors 42 and 44 provided thereon. A coil 46 has ends connected to the conductors 42 and 44, as by soldering thereto. The conductor 42 may be connected to other components or to a terminal for connection to other elements. The conductor 44 extends between a terminal 48 and a terminal 50, with the coil 46 being connected to the terminal 48. The conducting portion between the terminals 48 and 50 is shaped to form a loop 52 with bridges 53 and 54 connected thereacross.

As in the construction of FIG. 1, the bridges 53 and 54 can be selectively open circuited by cutting with a laser beam along the lines 56 and 57. As described in connection with the circuit of FIG. 1, the bridge 53 will provide the effective circuit path and will provide a minimum inductance value. If sections are cut from the bridge 53, the bridge 54 will form the effective circuit path and the inductance value will be larger. If sections are cut from both the bridges 53 and 54 to open circuit the same, the entire loop 52 will be connected in the circuit to provide the maximum inductance.

The bridge 53 (and the bridge 54) can be cut by the use of a laser beam along the dashed lines 56 and 57 to cut out sections of the conductor. This operation can take place without providing substantial heat on the substrate 40, so that the solder connections of the coil 46 to the conductors 42 and 44, and the connections of any other components to the conductors will not be affected. This adjustment of the inductance can take place after the circuit is completely assembled and operative, and tests are made to determine whether the inductance value of the coil 46 and the conductor 44 in series is the optimum value. This, therefore, permits trimming of the inductance value of a discrete fixed coil, which can be provided at much less cost than a discrete variable inductor. This adjustment is much easier to perform than changing the coil to provide a coil having a different inductance value, in the event that the inductance value is not optimum.

The microelectronic variable inductor of the invention has been found to be very useful in a radio frequency amplifier for a miniature radio transmitter which provides relatively high power. The ability to change the value of the microelectronic inductor after the amplifier is constructed, makes it possible to test and align the unit so that it is not necessary to perform additional alignment when the amplifier is connected in the radio. The inductor can be constructed at low cost, and it requires a relatively small space so that it is suitable for use in miniature electronic devices.

We claim:
1. A microelectronic circuit including in combination:
   a ceramic substrate forming an insulating support;
   conductor means on one side of said support having a predetermined pattern with a portion thereof forming an inductor having a plurality of parallel branches;
   an electronic component connected to said conductor means and cooperating therewith to provide an operative circuit,
   said plurality of parallel branches of said inductor being designed to be selectively severed by laser beam so as to avoid substantial heating of said substrate support while being effective to change the value of said inductor and in turn the circuit operation.

2. A microelectronic circuit in accordance with claim 1 wherein said conductor means is formed as a spiral with a turn thereof having a loop with bridges thereacross to form said parallel branches.

3. A microelectronic circuit in accordance with claim 1 including an inductance coil connected to said conductor means in series with said inductor portion thereof, with said coil and said inductor portion having a predetermined total inductance value, and wherein the selective severing of said parallel branches acts to change the total inductance value.

4. a microelectronic circuit in accordance with claim 3 wherein said inductor portion of said conductor means being shaped to form a loop with a bridge thereacross to form said parallel branches.

5. In a microelectronic circuit including a conductor provided on a ceramic substrate foaming an insulating support with at least one component connected to the conductor by heat sensitive connecting means, and wherein the conductor has a portion forming an inductor with a plurality of parallel branches,
   the method of varying the inductance value of the inductor portion to provide a desired operation of the circuit, including the steps of,
   testing the circuit to determine the operating characteristics thereof, and
   removing a particular section from one branch of the inductor protion of the conductor by laser beam to change the value of said inductor portion and thereby change the operation of the circuit.

* * * * *